United States Patent [19]
Pauna

[11] Patent Number: 6,052,524
[45] Date of Patent: Apr. 18, 2000

[54] SYSTEM AND METHOD FOR SIMULATION OF INTEGRATED HARDWARE AND SOFTWARE COMPONENTS

[75] Inventor: Mark R. Pauna, Lombard, Ill.

[73] Assignee: Software Development Systems, Inc., Lombard, Ill.

[21] Appl. No.: 09/079,448

[22] Filed: May 14, 1998

[51] Int. Cl.[7] .................................................. G06B 17/00
[52] U.S. Cl. ........................ 395/500.43; 703/19; 703/21; 703/28; 716/4
[58] Field of Search ............................ 395/500.4, 500.43, 395/500.42, 500.49, 500.05

[56] References Cited

U.S. PATENT DOCUMENTS

| | | | |
|---|---|---|---|
| 5,146,460 | 9/1992 | Ackerman et al. | 714/33 |
| 5,329,471 | 7/1994 | Swobada et al. | 395/500.34 |
| 5,475,605 | 12/1995 | Lin | 395/500.07 |
| 5,493,507 | 2/1996 | Shinde et al. | 395/500.35 |
| 5,544,067 | 8/1996 | Rostoker et al. | 395/500.35 |
| 5,600,579 | 2/1997 | Steinmetz, Jr. | 395/500.34 |
| 5,615,357 | 3/1997 | Ball | 395/500.42 |
| 5,678,028 | 10/1997 | Bershteyn et al. | 395/500.43 |
| 5,715,443 | 2/1998 | Raghavan et al. | 395/500.42 |
| 5,862,361 | 1/1999 | Jain | 395/500.37 |
| 5,870,585 | 2/1999 | Stapleton | 395/500.36 |
| 5,949,993 | 9/1999 | Fritz | 395/500.43 |

OTHER PUBLICATIONS

Liu et al., "Software timing analysis using HW/SW cosimulation and instruction set simulator," Proc. of the 6th Int. Workshop on Hardware/Software Codesign (CODES/CACHE '98), Mar. 1998, pp. 65–69.

Kienhuis et al., "An approach for quantitative analysis of application–specific dataflow architectures," Proc. IEEE Int. Conf. on Application–Specific Systems, Architectures and Processors, Jul. 1997, pp. 338–349.

*Primary Examiner*—Kevin J. Teska
*Assistant Examiner*—Kyle J. Choi
*Attorney, Agent, or Firm*—McDonnell, Boehnen, Hulbert & Berghoff; Stephen Lesavich

[57] ABSTRACT

A system and methods are provided to design, verify and develop simulated hardware and software components for a desired electrical device. The system includes a cycle-accurate simulator where X-number of simulator cycles is equivalent to Y-number of cycles on a simulated hardware component. The system further includes a simulator library for modeling and verifying hardware components of a desired electronic device. The simulator library includes built-in models and routines for simulating multiple internal hardware components. The simulator library is used with the cycle-accurate simulator. The system also includes a simulation Application Program Interface ("API") for allowing user-customized model and routines of internal and external hardware components to be used with the cycle-accurate simulator. The system can be used to design, verify and develop on-chip and off-chip components for a system-on-a-chip used in a desired electrical device. The methods provided include first method to simulate a requested operation for a simulated component far in the future with a fixed-length cycle counter by adjusting internal cycle counts in the cycle-accurate simulator for the requested operation and for the fixed-length cycle counter. A second method is used to send a not-ready response for a requested operation, when the requested operation takes longer than an estimated number of cycles in the cycle-accurate simulator. The system and methods allow for detecting access errors, bus faults, invalid address translations, privilege protection violations, alignment violations and other timing and behavior violations for simulated hardware and software components and the integration thereof.

27 Claims, 6 Drawing Sheets

SYSTEM AND METHOD FOR SIMULATION OF INTEGRATED HARDWARE AND SOFTWARE COMPONENTS

COPYRIGHT AUTHORIZATION

A portion of the disclosure of this patent document contains material. which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF INVENTION

This invention relates to computer simulation. More specifically, it relates to a cycle-accurate simulation of integrated hardware and software units with a virtual integration environment.

BACKGROUND OF THE INVENTION

Many electronic devices are designed and developed with highly integrated hardware and software components. The electronic devices typically have multiple hardware components including one or more central processing units ("CPU"), static or dynamic memory such as Read Only Memory ("ROM) and Random Access Memory ("RAM"), memory management units, one or more caches, buses, timers, peripherals, and other components. Multiple software components such as device drivers, operating systems and application programs are used to interact with the multiple hardware components to provide a desired functionality.

As is known in the art, new electronic devices in the past were often designed around general purpose hardware components such as a general purpose central processing unit. Many times, a new electronic device was designed without having actual access to one or more general purpose hardware components. In such a scenario, the accessible hardware components of the electronic device were assembled (e.g., bus, memory and power supply) while other hardware components such as the central processing unit were replaced with an In-Circuit Emulator ("ICE") or other device that allowed the behavior of that hardware component to be emulated. Software components for the electronic device were then developed using the existing hardware components and the in-circuit emulator. When the new hardware component was available, it was inserted into the new electronic device and integrated with the developed software components.

As electronic device development became increasing complex, very few hardware components of the system were built without performing a design verification first. The design verification was used to confirm that hardware components result in a design that operates in accordance with predetermined functional specifications. Hardware Description Languages ("HDLs") were developed to emulate and verify the design of hardware components. Hardware description languages known in the art include Very High Speed Integrated Circuit Hardware Description Language ("VHSIC HDL" or "VHDL")), Programming Control Language ("PCL") and others. Hardware description languages provide a gate-level emulation of hardware devices. For more information on VHDL, see Institute of Electrical and Electronic Engineers ("IEEE") standard 1076, which is incorporated herein by reference. Hardware description languages generally include a set of instructions for sending and receiving data to an emulated device under test, storing and receiving data, and other interactions. This allows the behavior of a proposed hardware device to be verified before it is built.

In today's world, "co-verification" using simulation technologies allows developers to design and verify the behavior of hardware and software components in a new electronic device. Behavior of hardware and software components can be examined during a simulation by setting break-points, stopping the simulation at various states, and examining data generated by the simulation. Various simulations also allow certain hardware components to be emulated with a hardware description language while other hardware and software components are simulated.

Exemplary emulation/simulation environments using hardware description languages include: "Digital Circuit Design Assist System For Designing Hardware Units and Software Units in a Desired Digital Circuit, and Method Thereof," U.S. Pat. No. 5,493,507, by Shinde et al.; "Method and System for Creating, Deriving and Validating Structural Description of Electronic System From Higher Level, Behavior-Oriented Description, Including Interactive Schematic Design and Simulation," U.S. Pat. No. 5,544,067, by Rostoker et al; "Hardware Simulation and Design Verification System and Method," U.S. Pat. No. 5,600,579, by Steinmetz; and "Dynamic Software Model For Emulating Hardware," U.S. Pat. No. 5,715,433, by Raghavan, et al.

Hardware description languages provide a "hardware-centric" view of an electrical device. However, hardware description languages typically do not allow realistic simulation of timing or other interactions between hardware and software components. For example, hardware description languages may offer hardware emulation cycle rates of 10,000 cycles-per-second or less when an actual hardware component such as a central processing unit may actually execute at 200,000,000 or more cycles-per-second.

In addition, one of the most common and underestimated problems associated with the design of an electrical device is memory interaction. The speed and structure of memory typically has a significant impact on the performance of the electrical device. Existing emulators and simulators known in the art typically determine the internal behavior of memory every simulation or emulation cycle, and may further slow the execution of a simulation or emulation by an order of magnitude or more.

Thus, the slow speed of simulators and emulators using hardware description languages is unacceptable for determining many timing interactions between hardware and software components in a final system. As is known in the art, integration of hardware and software components in a final system is one of the most difficult problems encountered by developers of electrical devices.

There have been attempts to overcome some of the timing problems associated with simulators and emulators using hardware verification languages including: "Logic Simulation Using a Hardware Accelerator Together with an Automated Error Event Isolation and Trace Facility," U.S. Pat. No. 5,146,460, by Ackerman et al; "Timing Analysis for Logic Optimization Using Target Library Delay Value," U.S. Pat. No. 5,475,605, by Lin; and "Hardware-Software Debugger Using Simulation Speed Enhancing Techniques Including Skipping Unnecessary Bus Cycles, Avoiding Instruction Fetch Simulation, Eliminating the Need for Explicit Clock Pulse Generation and Caching Results of Instruction Decoding," U.S. Pat. No. 5,678,028, by Bershteyn, et al. However, as electronic devices continually increase in speed and require different types of high speed and low speed memory, such attempts to improve the timing problems still do not provide adequate simulation of timing interactions between hardware and software components in an electronic device.

In the last few years, electronics are not only executing at increased speeds but also significantly shrinking in size. These smaller, faster electronic devices include digital phones, pagers, wireless devices, hand held devices, personal digital assistants, and others. Many of these new faster smaller electronic devices use Application Specific Integrated Circuit chips ("ASIC"), Reduced Instruction Set Chips ("RISC") and other chips to provide a desired functionality in a small electronic device. For example, the M-Core processor by Motorola Corporation of Austin, Tex., and the Tri-Core processor by Siemens Corporation of New York, N.Y., provide low power chips with a reduced instruction set optimized to provide good code density and memory access efficiency for a small electronic device.

New electronic devices are also being implemented as a "System-on-a-Chip" ("SoC"). System-on-a-chip designs integrate processors, memory, buses, and other components selected by a designer on a single integrated circuit chip. An electronic device with a system-on-a-chip, is not designed with separate off-the-shelf hardware components due to space and power limitations. Instead, a system-on-a-chip is a custom chip specifically designed for a desired purpose in a specific electronic device. For example, the M-Core processor may be selected with high-speed RAM, a memory management unit, a bus, a serial port for sending and receiving text, and integrated in silicon or other materials on a single chip to create a system-on-a-chip (e.g., for a pager)

System-on-a-chip designs are also making increased use of integrated hardware components to create complex embedded systems. For example, on-chip Digital Signal Processors ("DSP") are often used in connection with high-speed on-chip memory, pulling data from independent memory banks to improve processing bandwidth. A memory hierarchy with many different timing constraints may be used to reduce power consumption by storing commonly used data in on-chip instruction and data caches while less commonly used data and program overlays are stored in slower off-chip memory without caches. System-on-a-chip designs make it possible to customize the number and speed of on-chip components as well as off-chip peripherals and components for a proposed device with a pre-determined functionality.

However, system-on-a-chip designs present additional problems for simulators and emulators known in the art. As was discussed above, most simulators and emulators that use hardware design languages do not accurately reflect timing interactions among components of a system. This typically leads to complex problems during integration of hardware and software components, which is magnified for system-on-a-chip designs due to the potentially complex interaction of on-chip and off-chip components.

Many simulators and emulators that use hardware description languages also do not allow external or off-chip peripherals, memory, busses, Liquid Crystal Display controllers ("LCD") or other peripherals to be easily modeled for system-on-a-chip designs. Only internal or on-chip components are modeled. As a result, software developers are often forced to "stub" out routines that access off-chip peripherals, memories, buses, liquid crystal display controllers or other peripherals. This makes it difficult to develop device drivers for off-chip memory or peripherals and can also lead to complex integration problems such as bus and memory collisions. Thus, design flaws for off-chip components may be hidden until the system-on-a-chip is actually used with real off-chip hardware components.

New electronic devices often require multiple off-chip central processing units that cooperate and interact to exchange data. Many simulators and emulators that use hardware description languages known in the art do not allow multiple off-chip central processing units, that may have multiple on-chip and off-chip components themselves, to be easily modeled and do not allow data to be passed to/from such off-chip processing units to on-chip processing units. This limits the type of system-on-a-chip for a new electronic device that can designed and developed with existing simulators and emulators.

Thus, it is desirable to have a simulator or emulator that can be used to model on-chip and off-chip components as well as provide a more accurate representation of the interactions among on-chip and off-chip components including timing interactions for system-on-a-chip designs. The simulator should be capable of allowing system-on-a-chip as well as other electronic systems to be designed, verified and developed with a high level of confidence that the actual system will meet pre-determined design functionality for a new electronic device.

SUMMARY OF THE INVENTION

In accordance with the preferred embodiments of the present invention, a system and methods for simulation of integrated hardware and software components are provided. The system includes a cycle-accurate simulator where X-number of simulator cycles is equivalent to Y-number of cycles on a simulated hardware component. For example, one cycle-accurate simulator cycle is equal to 0.1 cycles on a simulated hardware component. The cycle-accurate simulator models stages of an operation execution pipeline for a desired hardware component (e.g., a central processing unit). The cycle-accurate simulator may indicate how long an operation takes to execute and may indicate the timing and sequence of operations as they occur. The cycle-accurate simulator is preferably event driven, and events are used to determine timing behavior and interactions of hardware and software components in a simulation. The cycle-accurate simulator also may be used in an "instruction timing" mode, where the number of cycles required for a general operation is determined, but the order or timing of individual operations that make up the general operation are not simulated.

The system further includes a simulator library for modeling and verifying hardware components of a desired electronic device. The simulator library may include built-in models for simulating multiple internal and external hardware components (e.g., central processing units, memory, memory management units, caches, timers, universal asynchronous receiver transmitters and digital signal processors). The built-in models return a number of cycles on the cycle-accurate simulator executed for a desired simulated operation. The simulator library may also include simulator interface routines for setting a clock for a simulated component to a new clock speed, coordinating between a simulator library clock and a cycle-accurate simulator clock, handling events that occur before or during a current clock cycle, changing interrupt vectors and interrupt priority levels, providing notification of changes in registers during a simulated operation, or for setting one or more individual sub-components (e.g., status bits) of a simulated hardware component. The simulator library with built-in models and routines is used as an interface to the cycle-accurate simulator.

The system also includes a simulation extension Application Program Interface ("API"). The simulator extension API is an interface allowing user-customized models of internal and external hardware components (e.g., liquid crystal display controllers, direct memory access controllers) to be used with the cycle-accurate simulator and the simulator library. The system optionally includes a graphical user interface for sending inputs to, and receiving outputs from the cycle-accurate simulator.

In one embodiment of the present invention, the internal hardware components of the system are on-chip hardware components and the external hardware components of the system are off-chip hardware components used in the design and verification of a system-on-a-chip for an electronic device. However, the system of present invention is not limited to the design and verification of system-on-a-chip hardware components and can be used to design and verify other electronic systems.

In accordance with another aspect of the invention, a method for hardware-software verification in a simulation is provided that includes receiving a request for a simulated operation on a cycle-accurate simulator from a simulated component. The requested simulated operation is determined to need X-number of cycles on the cycle-accurate simulator to complete the requested operation. A result is returned that includes Y-number of cycles, an actual number of cycles on the cycle-accurate simulator that were used to complete the operation.

In accordance with another aspect of the present invention, a method for determining timing and behavior violations for simulated hardware and software components is provided that includes receiving a request for a simulated operation from a simulated hardware component on a cycle-accurate simulator. The requested simulated operation requests X-number of cycles on the cycle-accurate simulator and the cycle-accurate simulator has a cycle-counter of a fixed length for counting Y-number of cycles, where Y is less than X. The cycle-counter and the X-number of cycles are periodically adjusted by a pre-determined value. This allows the cycle-accurate simulator with the cycle-counter of a fixed length for counting Y-number of cycles to provide a requested simulated operation request at X-number of cycles, where Y is less than X.

The foregoing and other features and advantages of a preferred embodiment of the present invention will be more readily apparent from the following detailed description, which proceeds with references to the accompanying drawings.

DETAILED DESCRIPTION OF THE PREFERRED EMBODIMENTS

Hardware-software Design Verification System

Figure 1:
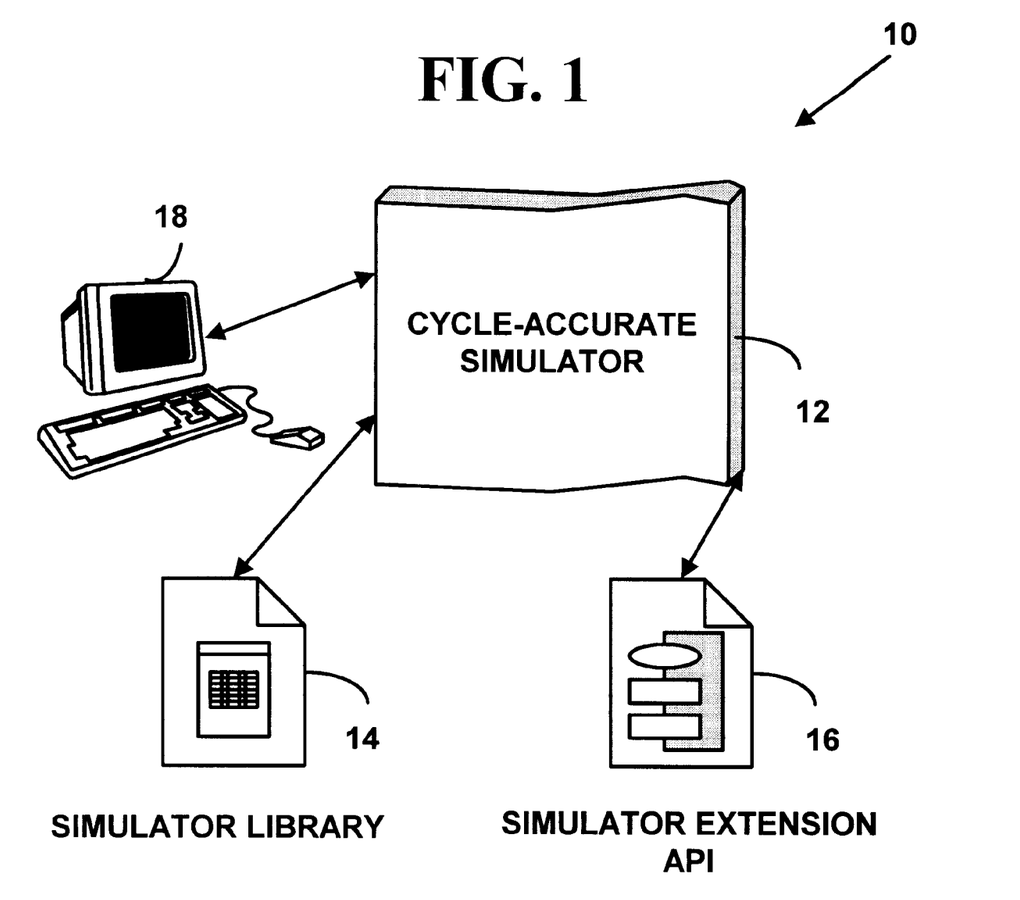
FIG. 1 is a block diagram illustrating a hardware-software design verification system.

FIG. 1 is a block diagram illustrating a hardware-software design verification system 10 for a preferred embodiment of the present invention. The hardware-software design verification system 10 includes a cycle-accurate simulator 12. Cycle-accurate simulator 12 models stages of an operation execution pipeline for a desired hardware component (e.g., a central processing unit).

As is known in the art, an operation execution pipeline is used to read consecutive instructions while previously read instructions are being executed. This causes instruction fetch and execution cycles to overlap and perform simultaneous operations. Cycle-accurate simulator 12 indicates how long (i.e., number of cycles) an instruction takes to execute and indicates the sequence of memory accesses and clock cycles when memory accesses occur. During the execution of cycle-accurate simulator 12, X-number of simulator cycles are equivalent to Y-number of cycles on a simulated hardware component. For example, ten cycles on cycle-accurate simulator 12 may be equal to one simulated cycle for a simulated hardware component. The actual number of cycle-accurate simulator 12 cycles is dependent upon the specific type of hardware component being simulated.

Cycle-accurate simulator 12 is event driven, and events are used to determine timing behavior and interactions of simulated hardware and software components. Cycle-accurate simulator 12 also can be used in an "instruction-timing" mode, where the number of cycles required for a general operation is determined, but the order or timing of individual operations that make up the general operation are not simulated. For example, the number of cycles for a 32-bit memory "read" can be determined in the instruction-timing mode. However, the order or timing of the individual "fetch" and "store" operations that make up the more general "read" operation are not simulated in the instruction-timing mode.

Hardware-software design verification system 10 further includes a simulator library 14 for modeling and verifying hardware components using built-in simulation models. The simulator library includes built-in models for multiple internal and external hardware components (e.g., central processing units, memory, digital signal processors memory management units, caches timers, universal asynchronous receiver transmitter and digital signal processors). The simulator library with built in routines is used as an interface to cycle-accurate simulator 12.

Hardware-software design verification system 10 also includes a simulator extension Application Program Interface ("API") 16. Simulator extension API 16 is an interface for allowing user-customized models of internal and external hardware components (e.g., liquid crystal display controllers, direct memory access controllers) to be used with cycle-accurate simulator 12 and simulation library 14. Hardware-software design verification system 10 optionally includes a Graphical User Interface ("GUI") 18 for sending inputs to, and receiving outputs from cycle-accurate simulator 12. In one embodiment of the present invention, Graphical User Interface 18 includes a windowed user interface. In another embodiment of the present invention, Graphical User Interface 18 is a text interface.

In one embodiment of the present invention, the internal hardware components modeled in hardware-software design verification system 10 are "on-chip" hardware components and the external hardware components arc "off-chip" hardware components used in the design and verification of a System-On-a-Chip ("SoC") for a desired electronic device. However, the system of present invention is not limited to the design and verification of SoC hardware and software components and can be used to design and verify other electronic systems or computer systems.

An operating environment for hardware-software design verification system 10 of a preferred embodiment of present invention includes a processing system with at least one high speed Central Processing Unit ("CPU") and a memory system. The CPU is of familiar design and any of a variety of processors, including those from Digital Equipment, Sun, MIPS, IBM, Motorola, NEC, Intel, Cyrix, AMD, Nexgen and others are equally preferred for CPU. Although described with one CPU, alternatively multiple CPUs may be used for a preferred embodiment of the present invention.

The memory system includes main memory and secondary storage. The main memory is high-speed random access memory ("RAM"). Main memory can include any additional or alternative high-speed memory device or memory circuitry. Secondary storage takes the form of long term storage, such as Read Only Memory ("ROM"), optical or magnetic disks, organic memory or any other volatile or non-volatile mass storage system. Those skilled in the art will recognize that the memory system can comprise a variety and/or combination of alternative components.

In accordance with the practices of persons skilled in the art of computer programming, the present invention is described below with reference to acts and symbolic representations of operations that are performed by the processing system, unless indicated otherwise. Such acts and operations are referred to as being "computer-executed" or "CPU executed."

It will be appreciated that the acts and symbolically represented operations include the manipulation of electrical signals by the CPU. An electrical system with data bits causes a transformation of the electrical signals. The maintenance of data bits at memory locations in a memory system thereby reconfigure or otherwise alter the CPU's operation. The memory locations where data bits are maintained are physical locations that have particular electrical, magnetic, optical, or organic properties corresponding to the data bits.

The data bits may also be maintained on a computer readable medium including magnetic disks, optical disks, and any other volatile or non-volatile mass storage system readable by the computer. The computer readable medium includes cooperating or interconnected computer readable medium, which exist exclusively on the processing system or may be distributed among multiple interconnected processing systems that may be local or remote to the processing system.

Cycle-accurate simulator 12, simulator library 14 and simulator extension API 16 of a preferred embodiment of the present invention are implemented in the C/C++ programming language. However, other programming languages can also be used. A preferred embodiment of the present invention is used on the Windows 95/NT operating system with a Visual C++ compiler by Microsoft Corporation of Redmond, Wash., Solaris operating system with a SunSoft SPARCompliler C/C++ compiler by Sun Microsystems of Mountain View, Calif., or HPUX operating system with a C++ SoftBench compiler by Hewlett Packet Corporation of Palo Alto, Calif. However, a preferred embodiment of the present invention can also be used on other operating systems and with other C/C++ compilers, and is not limited to the operating systems and compilers described above.

Simulator Library 14 and Simulator Extension API 16

Figure 2:
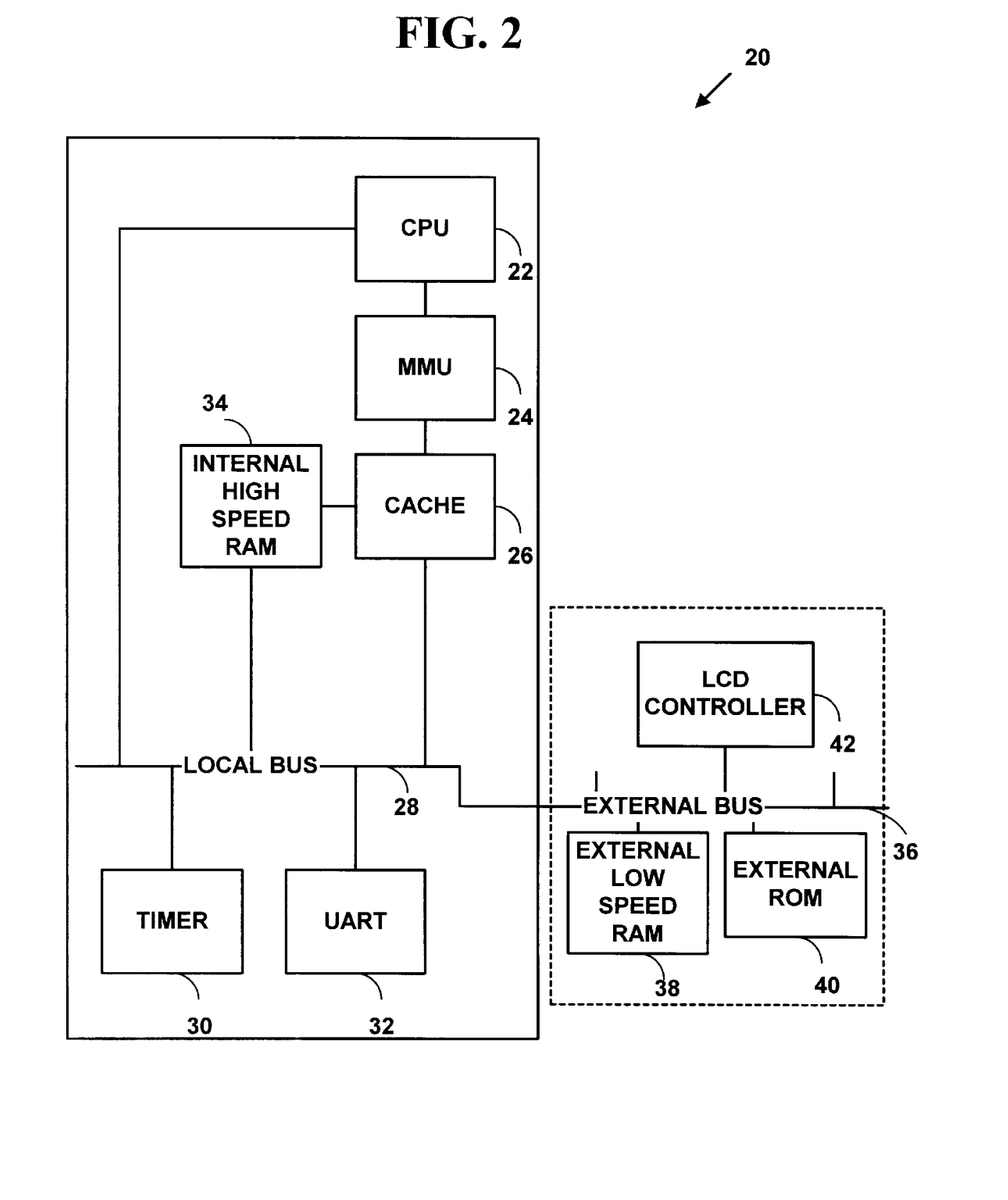
FIG. 2 is a block diagram illustrating hardware components of an exemplary electronic device.

FIG. 2 is a block diagram illustrating hardware components of an exemplary electronic device 20 to be modeled and verified with hardware-software design verification system 10. Electronic device 20 includes a CPU 22, a Memory Management Unit ("MMU") 24, a cache 26, a local bus 28, a timer 30, a Universal Asynchronous Receiver Transmitter ("UART") 32, and internal high speed RAM 34 that will be used as on-chip components for a system-on-a-chip. Electronic device 20 further includes an external bus 36, external lower speed RAM 38, external ROM 40, and a Liquid Crystal Display ("LCD") controller 42 that will be used as off-chip components with the system-on-a-chip. However, more or fewer on-chip or off-chip components can also be used.

In hardware-software verification systems known in the art, selected external or off-chip hardware components such as components 36, 38, 40 and 42 could not be easily modeled and verified in a simulation or emulation environment. However, a preferred embodiment of the present invention can be used to model and verify all, or any combination of the components shown in FIG. 2 using hardware-software design verification system 10 (FIG. 1). Hardware-software design verification system 10 allows the on-chip and off-chip hardware components of FIG. 2 to be modeled and simulated. The hardware components can be verified before they are actually built into a system-on-a-chip. In addition, corresponding software components such as device drivers, operating systems and applications programs can then be developed and used to verify the timing characteristics and other behavioral interactions between the hardware and software components.

In a preferred embodiment of the present invention, one interface to cycle-accurate simulator 12 is a set of simulator interface routines. The simulator interface routines are stored in simulator library 14 and can also be accessed from simulator extension API 16. The simulator interface routines include individual routines for setting a clock for a simulated component to a new clock speed, coordinating between a simulated component clock and a cycle-accurate simulator 12 clock, handling events that occur before or during a current clock cycle, sending a notification of changes in registers during a simulated operation, setting one or more individual sub-components of a simulated hardware component, a routine to lock and unlock a simulated bus, operate in a low power mode and other routines. Exemplary individual routines included in simulator library 14 are illustrated in Table 1. However, the simulator interface routines may include more or fewer individual routines and the present invention is not limited to the individual routines listed in Table 1.

TABLE 1

| Simulator interface routines included in simulator library 14 | Description |
| --- | --- |
| mmk_newclock | Set a clock for a simulated component to a new clock speed. The clock is set to a speed measured in Kilo-cycles-per-second (i.e., KHz). |
| mmk_adjustclock | Coordinate between a simulated component clock and a cycle-accurate simulator 12 clock (See FIGS. 3A and 3B). |
| mmk_event | Handle events that occur before or during a current clock cycle. |
| mmk_reg_notify | Send a notification of changes in one or more registers during a simulated operation. |
| mmk_setmode | Set one or more individual sub-components of a simulated hardware component. The sub-component include status bits, etc. |
| mmk_lock_bus | Lock or unlock a simulated bus to prevent another simulated component to accessing the bus. |
| mmk_low_power | Operate in a low power mode. |

The simulator interface routines also include multiple general purpose call-back routines. Simulator library 14 and simulator extension API 16 can use the general purpose call-back routines for displaying messages, accessing registers, changing interrupt vectors and interrupt priority levels, and other routines. Table 2 illustrates an exemplary list of general purpose call-back routines for a preferred embodiment of the present invention. However, more or fewer call-back routines could also be used.

TABLE 2

| General purpose call-back routine included in simulator library 14 | Description |
| --- | --- |
| errmsg | Return an error message. |
| warnmsg | Return a warning message. |
| diag | Return a diagnostic. |
| print | Print a desired message. |
| random_num | Return a random number. |
| set_event | Set an event to occur at a desired cycle. |
| change_irq | Change interrupt vectors and/or interrupt priority levels. |
| access_reg | Access a desired register on a simulated hardware component. |
| add_reg | Add a desired simulated register to a simulated hardware component. |

In addition to the general purpose call-back routines, component-specific call-back routines can also be used. In a preferred embodiment of the present invention, various component-specific call-back routines for the M-Core processor families, 68000 processor families CPU32 and CPU32+ processor families are provided. For example, the component-specific routines include routines to return the status of an instruction cache or a data cache for a desired processor. However, the present invention is not limited to component-specific call-back routines for M-Core processor families, 68000 processor families CPU32 and CPU32+ processor families and other component-specific call back-routines could also be used for other simulated hardware components. Component-specific call-back routines can also be provided by an end user, and used with cycle-accurate simulator 12 through the interface provided by simulator extension API 16.

The general purpose call-back routines are useful to accurately simulate a hardware component. For example, the M-Core processor has two interrupt priority levels, the 68000 has seven distinct interrupt priority levels, and the PowerPC 8xx has an integrated interrupt controller that manages up to eight external interrupt request signals and eight internal interrupt request signals. The call-back routine "change_irq" (Table 2) is used to change the interrupt priority levels and interrupt vectors when the M-Core, 68000 or PowerPC families of processor are simulated. The "change_irg" routines allow timing and other interactions with respect to interrupts to be accurately tested with cycle-accurate simulator 12 between simulated hardware and software components.

In a preferred embodiment of the present invention, another interface to cycle-accurate simulator 12 from simulator library 14 is a "Memory-Modeling-Kit" ("MMK") routine called "mmk_access" used to simulate and verify on-chip and off-chip memory (e.g., 34, 38, 40 of FIG. 2). Table 3 illustrates parameters used with mmk_access. However, more or fewer parameters could also be used. In Table 3 and other following tables, the designations are based on C/C++ programming syntax wherein "ulong" is an unsigned long integer value (e.g., 32-bits), "uchar" is an unsigned character(e.g., 8-bits), "int" is an integer value (e.g., 32-bits), the "*" designates a pointer and "#define" is a constant. The actual size of the values is dependent on the compiler used to compile a file that includes the mmk_access interface routine.

TABLE 3

Memory Management Simulation Interface
ulong mmk_access(ulong cycle, ulong mode, int super, ulong addr, ulong *data, int size, int write) returns - number of cycles required for memory access simulation.

| cycle | The current processor clock at the start of a memory access. |
| --- | --- |
| Mode | Memory access mode. |
| Super | Indicates the privilege level of access, zero is user/unprivileged; non-zero is supervisor/privileged). |
| Addr | Memory address being accessed. |
| Data | For writes, *data is a value being written to memory. For reads, data points to a buffer for storing a read value. |
| Size | A size of a memory access in bytes (1, 2, 4, 8 bytes) |
| Write | A flag to indicate whether data is to be read (zero) or written (non-zero) |

Included with the mmk_access interface illustrated in Table 3 in simulator library 14 are multiple built-in routines for simulating memory. Table 4 illustrates exemplary routines from simulator library used to provide a built-in model for simulating memory. However, more or fewer routines could also be used.

TABLE 4

| Routines included in simulator library 14 | Description |
| --- | --- |
| mmk_fetch8 | Fetch 8-bits (1-byte). |
| mmk_fetch16 | Fetch 1 6-bits (2-bytes). |
| mmk_fetch32 | Fetch 32-bits (4-bytes). |
| mmk_fetch64 | Fetch 64-bits (8-bytes). |
| mmk_flow8 | Change flow of an 8-bit operation (1-byte). |
| mmk_flow16 | Change flow of a 16-bit operation (2-bytes). |
| mmk_flow32 | Change flow of a 32-bit operation (4-bytes). |
| mmk_flow64 | Change flow of 64-bit operation (8-bytes). |
| mmk_pcrel8 | PC relative 8-bit operation (1-byte). |
| mmk_pcrel16 | PC relative 16-bit operation (2-bytes). |
| mmk_pcrel32 | PC relative 32-bit operation (3-bytes). |
| mmk_prcrel64 | PC relative 64-bit operation (4-bytes). |
| mmk_read8 | Read 8-bits from memory (1-byte). |
| mmk_read16 | Read 16-bits from memory (2-bytes). |
| mmk_read32 | Read 32-bits from memory (4-bytes). |
| mmk_read64 | Read 64-bits from memory (8-bytes). |
| mmk_write8 | Write 8-bits to memory (1-byte). |
| mmk_write16 | Write 16-bits to memory (2-bytes). |
| mmk_write32 | Write 32-bits to memory (4-bytes). |
| mmk_write64 | Write 64-bits to memory (8-bytes). |

A user may also replace any of the routines in Table 4 with user-customized routines for a specific memory component and access the routines through simulator extension API 16. For example, if hardware-software verification system 10 is being used on a computer running Windows 95/NT, simulator library 14 is a Dynamic Link Library ("DLL") (e.g., mmk.dll). A user can replace built-in routines in simulator library 14 with custom routines and store the custom routines in another dynamic link library (e.g., custom.dll). Simulator extension API 16 is used to access the user's custom routines instead of the built-in routines from simulator library 14. As is known in the art, user customized routines with the same name as a built-in library routine are typically used instead of built-in library routines.

As an example of the use of the mmk_access interface from simulator library 14, hardware device 20 (FIG. 2) is being designed to include 1 Mega-byte ("Mbyte") of fast zero-wait state on-chip RAM (e.g., 34) for a system-on-a-chip design. Hardware device 20 will also include 64 Kilo-bytes ("Kbyte") of slower one-wait state off-chip RAM (e.g., 38) and 64 Kbytes of slower two-wait state off-chip ROM (e.g., 40). The off-chip RAM can only be written if a central processing unit is in a supervisor mode, and the off-chip ROM can be modified by a debugger for testing purposes, but is not otherwise modifiable.

To simulate such a memory layout, three memory areas are implemented as is illustrated by the pseudo-code in Table 5. However, other memory layouts could also be used.

TABLE 5

```
/*
ram0    1 Mbytes of high speed on-chip RAM (34 FIG. 2) at address 0x0.
Ram1    64 Kbytes of lower speed off-chip RAM (38 FIG. 2) at
        address 0xFFE0000.
Rom     64 Kbytes of off-chip ROM (40 FIG. 2) at address 0xFFFF0000.
*/
#define BASE_RAM0   0x00000000L /* base address
                                    for RAM0 (34) bank */
#define BASE_RAM1   0xFFFE0000L /* base address for RAM1 (38)
                                    bank */
#define BASE_ROM    0xFFFF0000L /* base address for ROM (40)
                                    bank */
#define MASK_RAM0   0x000FFFFFL /* address mask for RAM0
                                    (1 Mbyte) */
#define MASK_RAM1   0x0000FFFFL /* address mask for RAM1
                                    (64 Kbytes) */
#define MAKS_ROM    0x0000FFFFL /* address mask for ROM
                                    (64 Kbytes) */
uchar ram0 [MASK_RAM0 + 1]; /* RAM0 memory image */
uchar ram1 [MASK_RAM1 + 1]; /* RAM1 memory image */
uchar rom [MASK_ROM +.1]; /* ROM memory image */
```

Table 6 illustrates an exemplary mmk_access routine used with cycle-accurate simulator 12 and simulator library 14 to simulate the memory layout illustrated in Table 5. The routine is exemplary only, and other mmk_acccess routines could also be used with simulator library 14. The number of cycles required for the requested simulated memory access is returned by the call to mmk_access (e.g., the cycle parameter).

TABLE 6

```
ulong mmk_access(ulong cycle, ulong mode, int super, ulong
addr, ulong *data, int size, int write)
{
    /* see Table 3 for a description of mmk_access parameters */
    uchar ptr; /* pointer to the first byte in memory */
    ulong cycles /* number of clock cycles required for memory access */
    /* make sure that the address is properly aligned (i.e., a 16-bit
        access must be aligned to an even byte, and a
        32-bit access must be aligned to a multiple of 4
        bytes). If the address is not properly
        aligned generate a bus fault
    */
    if(addr & (size -1)) return (MMK_BUS_ERROR | access_time);
    /* decode the address to determine what memory is being
    accessed. If the address is not valid, a bus
        error occurs.
        The following mmk_access variable s are modified:
        addr - an offset relative to the base address of the memory area.
        ptr - pointer to the actual byte in memory
        cycles - number of clock cycles required for the memory access.
        RAM1 (38) is only valid if "super" is set.
        ROM (40) can only be written to by a debugger during
        simulation and is otherwise not writeable
    */
    addr -= BASE_RAM0;
    if (addr <= MASK_RAM0)
        { ptr = ram0+addr; cycles = access_time; goto
```

TABLE 6-continued

```
        found; } /* zero-wait state access */
    addr -= (BASE_RAM1 - BASE_RAM0);
    if(addr <= MASK_RAM1) && super)
        {ptr = ram1+addr; cycles = access_time+1; goto
        found}; /* one-wait state access */
    addr -= (BASE_ROM - BASE_RAM1);
    if(addr <= MASK_ROM &&
    (!write || (mode & MMKM_DEBUGGER))))
        {ptr = rom + addr; cycles = access_time+2; goto
        found}; /* two-wait state access */
    return (MMKR_BUS_ERROR | access_time);
    found:
        if(write)
        {
            switch (size) /* 1, 2 or 4 bytes */
            {
                case 4: write32(cycles, ptr, data); /* calls e.g.,
                    mmk_write32 from Table 2 */
                break;
                case 2: write16(cycles, ptr, data);
                break;
                case 1: write8(cycles, ptr, data);
                default:
                    return (MMKR_BUS_ERROR | cycles);
        }
        else /* read */
        {
        switch (size):
                case 4: read32(cycles, ptr, data); /* Calls e.g.,
                    mmk_read32 from Table 4 */
                break;
                case 2: read16(cycles, ptr, data);
                break;
                case 1: read8(cycles, ptr, data);
                default:
                    return (MMKR_BUS_ERROR | cycles);
        }
        return (cycles); /* return the number of cycles used for
        the memory access */
}
```

The built-in routines from simulator library 14 can also be replaced by custom-routines and stored in a user-customized library. A user-customized library is used with cycle accurate simulator 12 from simulator extension API 16. Table 7 illustrates an exemplary user-customized routine (i.e., my_read32) to replace the built-in 4-byte read routine (i.e., read32) from simulator extension library 14.

TABLE 7

```
/* see pseudo-code from Table 6 */
. . .
switch(size):
case 4: my_read32(cycles, ptr, data);
break;
case 2: read16(cycles, ptr, data);
break;
case 1: read8(cycles, ptr, data);
default:
    return (MMKR_BUS_ERROR | cycles);
. . .
/* this routine is placed in a user-customized library */
my_read32(ulong cycles, ulong ptr, ulong *data);
{/* read 4-bytes at a time using shifts */
    *data = ((ulong)ptr[0] << 24 | ((ulong)ptr[1] << 16) | ((ulong)ptr[2]
    << 8) | ptr[3];
    *cycles += 8; /* 8 cycles used to read 4-bytes */
    return(0);
}
. . .
```

The mmk_access interface routine illustrated in Table 7 is stored in a source file (e.g., device_mem_test.c) and compiled with the built-in routines in simulator library 14. The mmk_access interface routine illustrated in Table 7 is used by cycle-accurate simulator 12 from simulator extension API 16 to simulate on-chip and off-chip memory (e.g., 34, 38, 40) for exemplary electrical device 20 shown in FIG. 2.

If a user decides to customize one or more routines, such as the "my_read32" routine shown in Table 7, the new routine is placed in simulator extension API 16 (e.g., in a new dynamic link library) that is compiled with the built-in routines from simulator library 14. If a custom routine has the same name as a built-in routine, the custom routine from simulator extension API 16 is used instead of the built-in routine from simulator library 16. This allows a user significant flexibility to customize a given hardware or software component for a desired electrical device.

The examples in Tables 3–7 illustrate simulation of on-chip and off-chip memory. Additional built-in routines from simulator library 14 and from user-customized routines used through simulator extension API 16 are used to simulate other hardware components (e.g., on-chip memory management unit 24, on-chip cache 26, on-chip local bus 28, on-chip timer 30, on-chip UART 32, off-chip LCD controller 42, and off-chip external bus 36). Simulating hardware components for a desired electrical device allows corresponding software components to be developed, and the timing interactions and other behavior between the simulated hardware components and the software components to be examined and verified.

The built-in routines in simulator library 14 return a status value that usually indicates the number of cycles that elapse as a requested operation completes. The number of cycles returned by built-in routines can be used by internal and external simulated components. The number of cycles returned by built-in routines are also available to routines in simulator extension API 16. Simulator library 14 supports a number of central processing units with built-in models including the M-Core processor families, 68000 processor families (e.g., 68000, 68008, 68010, 68012, 68020, 68030, 68040, 68060, 68302, 68306, 68307, 68322, 68328, 68356, etc.), CPU32 and CPU32+ processor families (e.g., 68332, 68340, 68349, 68360, etc.) by Motorola Corporation of Austin, Tex. and multiple licensees of Motorola, and PowerPC processor families by Motorola (e.g., PowerPC 4xx, 5xx, 6xx, 7xx, 8xx, etc.). Simulator library 14 also may preferably include built-in routines for memory management units, digital signal processors, address translation units, access control units, instruction caches, data caches, system integration units, chip selects and LCD controllers that are used with the built-in models for the central processing units.

Not every central processing unit supports hardware components for which built-in routines are available in simulator library 14. For example, the M-Core processor does not include an instruction cache or data cache, so built-in routines are not available for instruction or data caches for the M-Core processor in simulator library 14. However, if a user desired to add an instruction cache or data cache for a custom M-Core processor, the appropriate routines could be added and used via simulator extension API 16.

In addition, cycle-accurate simulator 12 and simulator library 14 can be used with existing hardware definition languages that may be used to simulate a desired hardware component. Hardware-software design verification system 10 is designed to augment existing HDL simulation techniques. Through its interfaces, hardware-software design verification system 10 can communicate with other co-verification and simulation tools including returning a number of cycles used to complete a desired simulated operation. These co-verification and simulation tools can gain access to simulation memory contents of hardware-software design verification system 10, making it easier to simulate hardware components that exist only in HDL form. Thus, HDL hardware components can also be integrated with hardware components simulated by hardware-software design verification system 10.

Cycle-accurate Simulator 12

Cycle-accurate simulator 12 is preferably event driven. Events are used to determine timing behavior and interactions of simulated hardware and software components in the desired electronic device. Events allow faster simulation of simulated components by providing information about a simulated component at a scheduled event instead of every cycle. Event based simulation increases speed of a simulation while still providing accuracy achieved by determining information about a simulated component every cycle. In a preferred embodiment of the present invention, events are hardware and software interrupts. However, the present invention is not limited to interrupts and other events can also be used.

Co-verification simulators known in art typically determine the internal behavior and state of hardware and software components every cycle of a simulator. This provides accuracy, but may slow the simulation by an order of magnitude or more. Cycle-accurate simulator 12 in a preferred embodiment of the present invention allows events to be set and the internal behavior and state of hardware components to be accurately examined at specific events (e.g., after a memory access). This allows cycle-accurate simulator 12 to provide faster simulations of hardware and software components. Cycle-accurate simulate 12 can also determine internal behavior and state of hardware and software components every cycle by setting a first event to occur on a first simulator cycle and a second event to occur on a second simulator cycle, a third event to occur on a third simulator cycle, etc.

Built-in routines in simulator library 14 have a "cycle" argument that indicates a starting clock cycle for an event handled by the routines. On most host systems, a "clock-counter" is implemented as a 32-bit unsigned value that overflows after $2^{32}$ clock cycles or after about four-billion+ clock cycles. Since most simulators execute a number of simulator clock cycles for every clock cycle on a simulated hardware component (e.g., 10 simulator cycles are equal to 1 simulated hardware component cycle), and many simulated hardware components execute a very high speeds (e.g., 200,000,000 cycles-per-second), it is relatively easy to overflow the 4+ billion cycle-counter in a few seconds of simulated execution time for a given simulated hardware component. In most simulators, this limits how far in the future an event can be scheduled, and thereby limits the effectiveness of the simulator. Nonetheless, simulation of events far into the future is often necessary to test interactions between simulated hardware and software components.

For example, a read of a memory from a slow off-chip flash-ROM during a boot-sequence may take three seconds of real-time. For a simulated hardware device executing at 200,000,000 cycles-per-second, the device would execute 3*200,000,000=600,000,000 cycles during a read from the flash ROM. If a simulator executed 10 cycles for every one simulated hardware component cycle, the simulator will have executed 600,000,000*10=6,000,000,000 cycles or six billion cycles, which exceeds the 4+ billion cycle-counter of the simulator. In a preferred embodiment of the present invention, cycle-accurate simulator 12 uses a 32-bit cycle-counter, but overcomes such problems by using a sliding adjusted cycle count, as explained below.

Figure 3A:
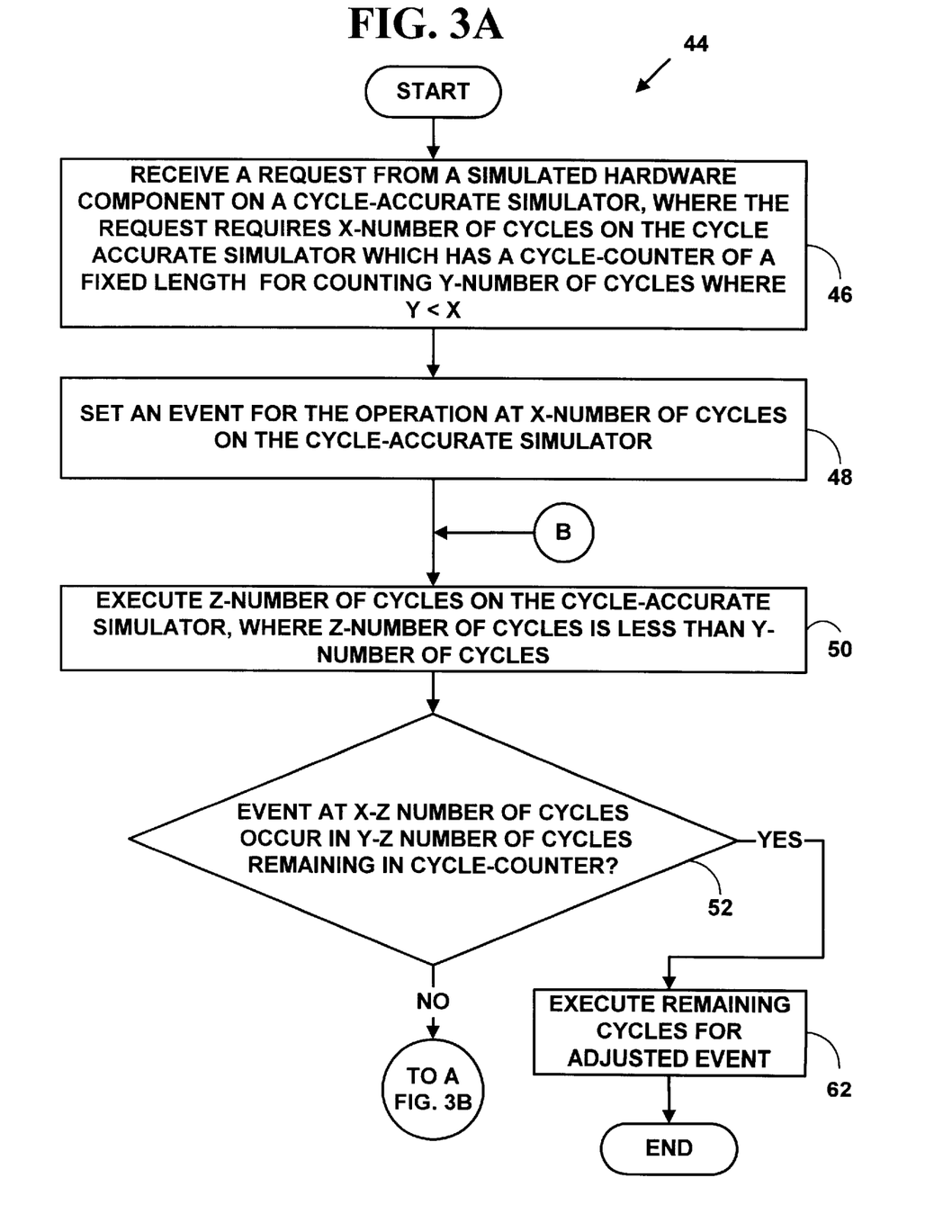
FIGS. 3A and 3B are flow diagram illustrating a method for hardware-software verification in a simulator.
Figure 3B:
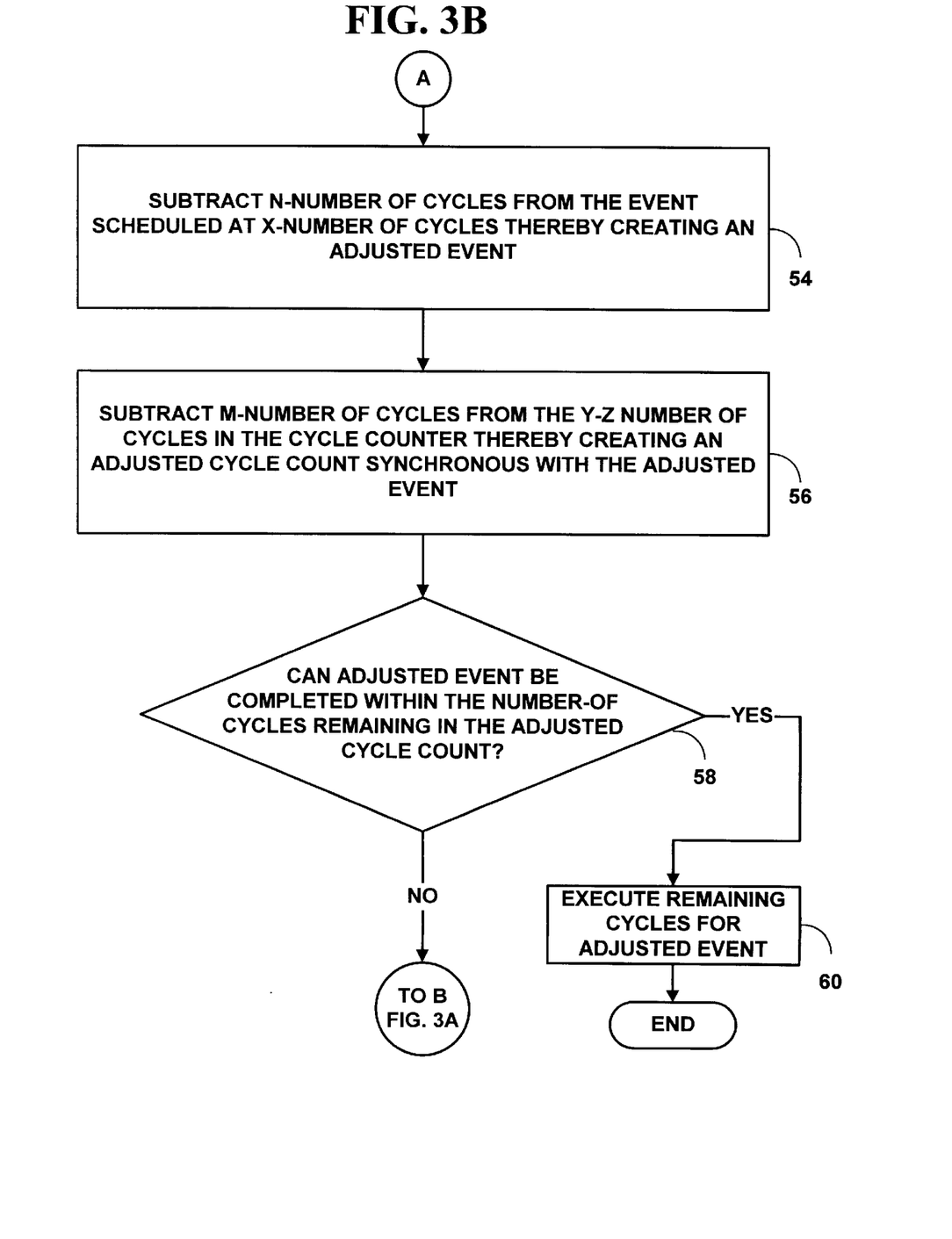

FIGS. 3A and 3B are a flow diagram illustrating a method 44 for hardware-software verification in a simulator. At step 46 of FIG. 3A, a request is received for an operation from a simulated hardware component on a cycle-accurate simulator, wherein the requested operation requires X-number of cycles on the cycle-accurate simulator. The cycle-accurate simulator has a cycle-counter of a fixed length Y_MAX for counting Y-number of cycles, where Y is less than X. At step 48, an event is set for the operation at X-number of cycles on the cycle-accurate simulator. At step 50, Z-number of cycles are executed on the cycle-accurate simulator, where Z-number of cycles is less than Y-number of cycles and the Z-number of cycles are counted in the cycle-counter. At step 52, a test is conducted to determine whether the event at X-Z number of cycles will occur within Y-Z number of cycles remaining in the cycle-counter.

If the event will not occur within the remaining Y-Z number of cycles remaining in the cycle-counter, at step 54 of FIG. 3B a clock-adjust value of N-number of cycles is subtracted from the event set at X-number of cycles, thereby creating an adjusted event. At step 56, a clock-adjust value of M-number of cycles is subtracted from the Y-Z number of cycles in the cycle-counter, thereby creating an adjusted cycle-counter count corresponding to the adjusted event. Steps 50, 52, 54 and 56 are repeated using the test at step 58 until the adjusted event will occur within the number of cycles remaining in the adjusted cycle-counter count at step 60 (FIG. 3B) or step 62 (FIG. 3A). In a preferred embodiment of the present invention, the adjusted event and adjusted cycle count in the cycle-counter are both adjusted by the same number of cycles (i.e., N-number of cycles is equal to M-number of cycles). In another embodiment of the present invention, the adjusted event and adjusted cycle count in the cycle-counter are adjusted by different number of cycles (i.e., N-number of cycles is not equal to M-number of cycles). In such an embodiment, cycle-accurate simulator uses additional methods to keep the adjusted event in correspondence with the adjusted cycle count in the cycle-counter.

An example of the use of method 44, includes a cycle-counter using 32-bits that has a maximum value Y_MAX of Y-number of cycles in hexadecimal of 0x4FFFFFFF and starts with a value of 0x0. However, other Y_MAX values and other starting values could also be used, and the present invention is not limited to the maximum and starting value described. For example, method 44 may be used to schedule an event with the cycle-counter currently at value of 0x38000000. A value is 0x0 is used to simplify the example described herein.

At step 46 of FIG. 3A, a simulated hardware component requests an event at X-number of cycles or 0x90000000 cycles. The X-number cycles or 0x90000000 exceeds the cycle-counter of Y_MAX for Y-number of cycles or 0x4FFFFFFF. At step 48, an event is set cycle-accurate simulator 12 at X-number of cycles or 0x90000000 cycles. At step 50, Z-number of cycles or for example, 0x40000000 cycles are executed on cycle-accurate simulator 12 starting with a cycle-counter value of 0x0. At step 52, a test is conducted to determine whether the event at X-Z cycles will occur within the remaining Y-Z number of cycles available in the cycle counter. That is, will 0x90000000–0x40000000=0x50000000 number of cycles remaining for the event occur in the remaining 0x4FFFFFFF–0x40000000=0x0FFFFFFF number of cycles available in the cycle-counter. The remaining 0x50000000 required for the event still exceeds the 0x0FFFFFFF remaining cycles in the cycle-counter, so it will not occur within the remaining Y-Z number of cycles in the cycle-counter. At step 54, a clock-adjust value of N-number of cycles or 0x40000000, is subtracted from the X-number of cycles of 0x90000000 for the event, or 0x90000000–0x40000000=0x50000000. The event will now occur at the new adjusted value of 0x50000000 remaining cycles. At step 56, the clock-adjust value of M-number of cycles or 0x40000000 number of cycles is also subtracted from the Z number of cycles in the cycle-counter, or 0x40000000–0x40000000=0x0 creating an adjusted cycle count in the cycle-counter corresponding to cycles in the adjusted event. In this example, the Z-number of cycles executed is equal to N-number of cycles for the clock adjust value. However, the present invention is not limited to clock adjust value of N-number of cycles equal to Z-number of cycles executed on cycle-accurate simulator, and non-equivalent values could also be used.

Steps 50, 52, 54 and 56 are repeated until the adjusted event will occur within the number of cycles remaining in the adjusted cycle count in cycle-counter at step 58. Continuing the above example, at step 50, Z-number of cycles or 0x40000000 cycles are executed on cycle-accurate simulator 12 starting with the adjusted cycle-counter value of 0x0. At step 52, it is determined whether the adjusted event at X-Z cycles will occur within the remaining Y-Z number of cycles available in the cycle counter. That is, will 0x50000000–0x40000000=0x10000000 number of cycles for the event occur in the remaining 0x4FFFFFFF–0x40000000=0x0FFFFFFF number of cycles available in the cycle-counter. The remaining 0x10000000 required for the event still exceeds the 0x0FFFFFFF remaining cycles in the cycle-counter, so it will not occur within the remaining Y-Z number of cycles in the cycle-counter. At step 54 of FIG. 3B, a clock-adjust value of 0x40000000 number of cycles is subtracted from the X-number of cycles of 0x50000000 for the event, or 0x50000000–0x40000000=0x10000000. The event will now occur at the adjusted event value of 0x10000000 remaining cycles. At step 56, the clock adjust value of 0x40000000 number of cycles is also subtracted from the Z number of cycles in the cycle-counter, or 0x40000000–0x40000000=0x0. The new adjusted event will now occur during the execution of Z-number of cycles at step 50, which is within Y-Z number of cycles for the adjusted cycle counter in the cycle-counter. The event requested at 0x90000000 cycles still occurs at 0x90000000 cycles within cycle-accurate simulator 12.

Method 44 allows virtually any event with a large number of cycles set far into the future requested by a simulated hardware component to be executed using a fixed-length internal cycle-counter on cycle-accurate simulator 12. An event requested far into the future has a cycle argument available to simulator library 14 and simulator extension API 16 that is in the range [0,Y_MAX] when method 44 is used in cycle-accurate simulator 12. During the execution of method 44, other shorter duration event requests are processed (e.g., events that fall within the 0x4FFFFFFF number of cycles for the fixed-length cycle-counter) while the cycle-counter is being adjusted for longer duration events. In a preferred embodiment of the present invention, method 44 is implemented in a "mmk_adjustclock" routine (e.g., Table 1).

In addition to allowing events far into the future, cycle-accurate simulator 12 also provides a method for detecting access errors, bus faults, invalid address translations, privilege protection violations, alignment violations and other timing and behavior violations. The built-in routines in simulator library 14 return a status value that usually indicates the number of cycles that elapse before a requested operation completes. Special flags can be set in the built-in routines in simulator 14 to generate a breakpoint signal when such events occur. This allows the design of simulated hardware and software components to be verified and integrated by observing the behavior of requested events.

When simulated operations are requested, a minimum number of cycles the requested operation needs to complete is determined by cycle accurate simulator 12. A simulated operation (e.g., a memory read) is requested using the simulator library 14 or simulator extension API 16. Cycle-accurate simulator 12 determines a minimum number of cycles needed to complete the operation. After the minimum number of cycles are executed, cycle-accurate simulator 12 determines if the requested operation completed in the minimum number of cycles. If not, a NOT_READY value is returned indicating the requested operation was not complete in the minimum number of cycles requested (e.g., because of a bus or a cache contention). The NOT_READY value includes an estimated number of cycles remaining to wait for the operation to complete. After waiting the estimated number of cycles returned in the NOT_READY value, the requested operation is checked again to see if it has been completed. If not, a second NOT_READY value is returned, and the process is repeated until the requested operation is completed.

The ability to return a NOT_READY value and other similar values from routines in simulator library 14 provides functionality for detecting access errors, bus faults, invalid address translations, privilege protection violations, alignment violations and other timing and behavior violations for simulated hardware and software components. These return values also aid in the integration of simulated hardware and software components for a desired electronic device.

Figure 4A:
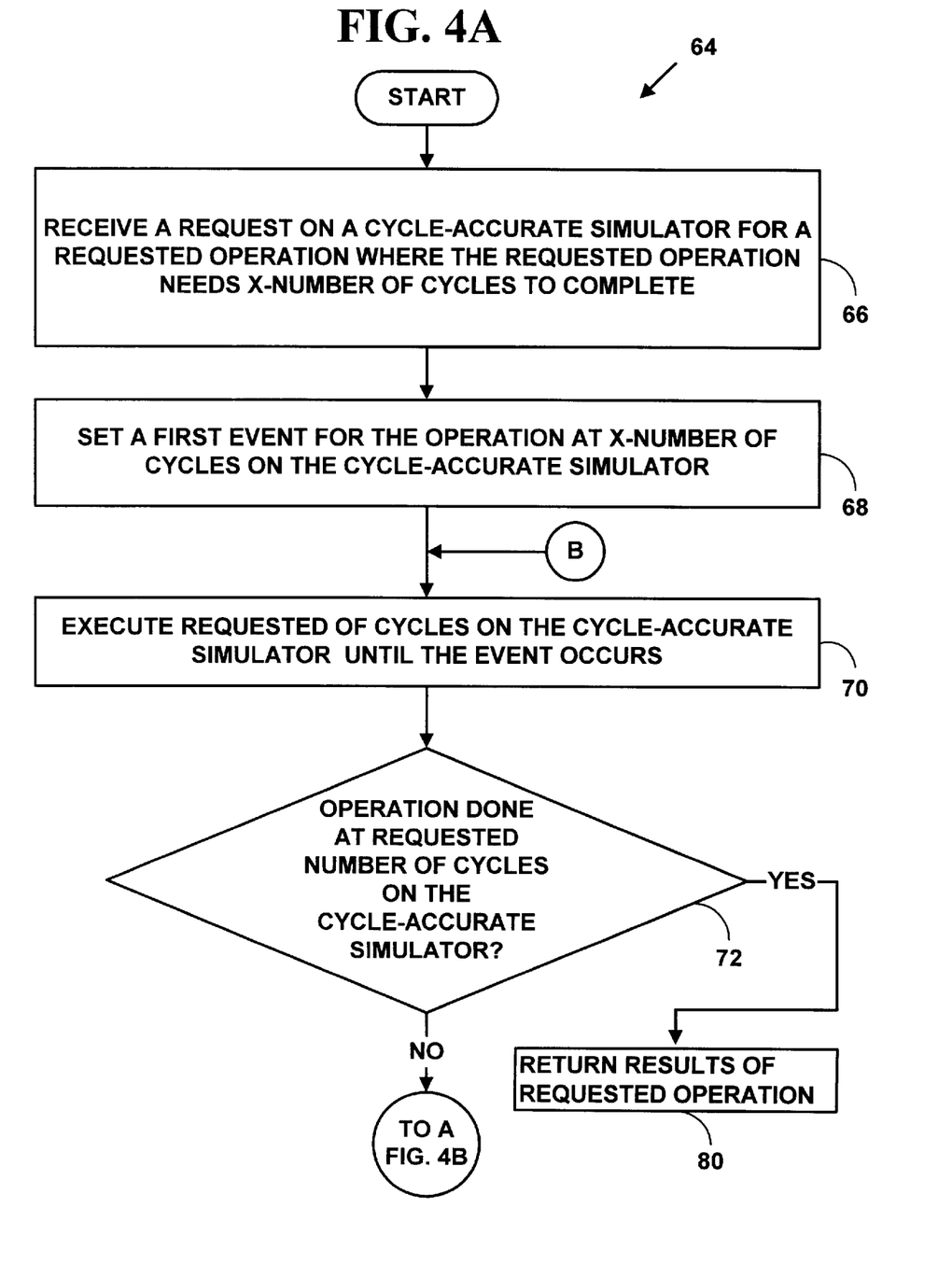
FIGS. 4A and 4B are a flow diagram illustrating a method for determining timing and behavior violations for simulated hardware and software components.
Figure 4B:
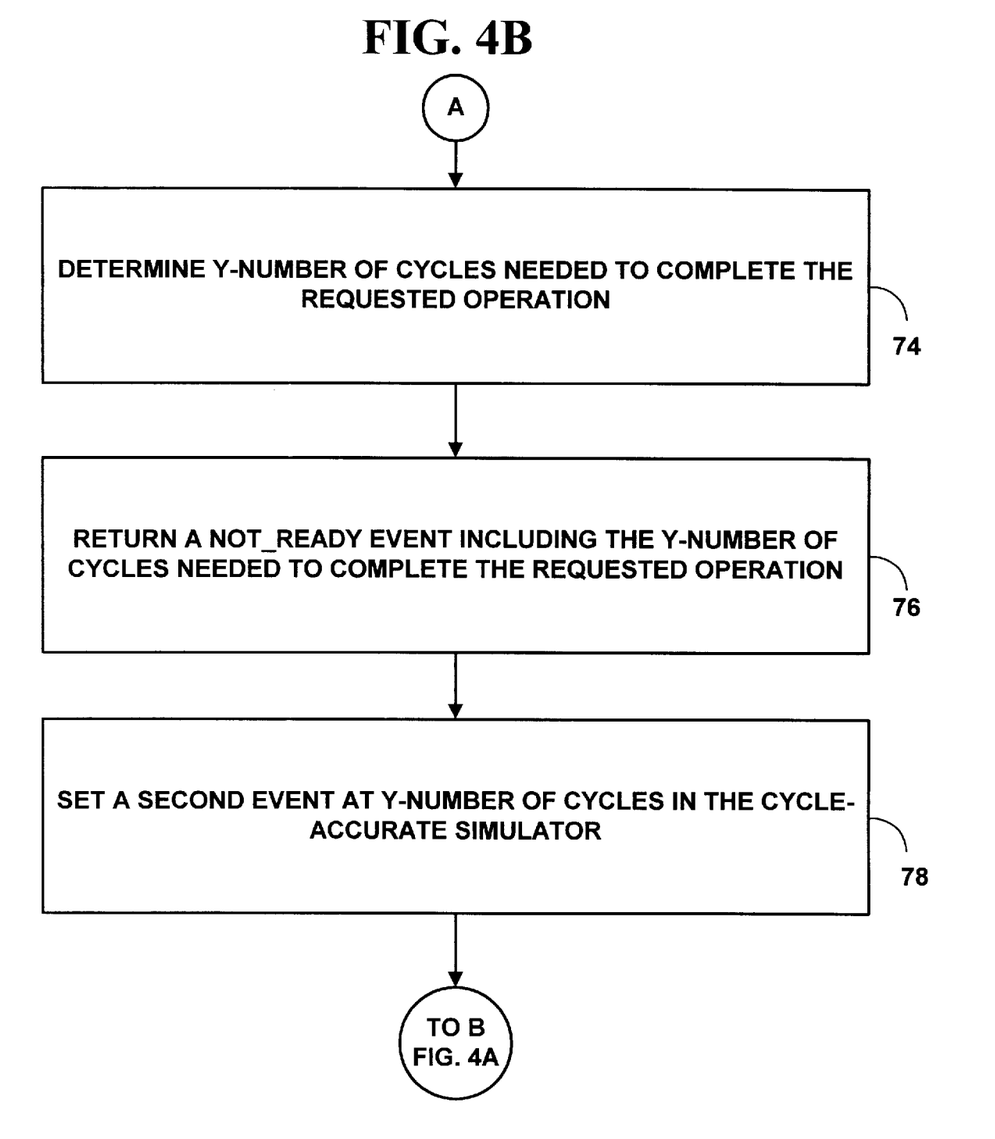

FIGS. 4A and 4B are a flow diagram illustrating a method 64 for determining timing and behavior violations for simulated hardware and software components. At step 66 in FIG. 4A, a request for a simulated operation is received in a cycle-accurate simulator 12. The request is made from a simulated hardware or software component. The cycle-accurate simulator 12 determines X-number of cycles needed to complete the requested operation. At step 68, a first event is set at X-number of cycles on the cycle-accurate simulator 12. At step 70, X-number of cycles are executed on the cycle-accurate simulator 12 and the first event occurs. At step 72, a test is conducted to determine whether the requested operation is complete after X-number of cycles.

If the requested operation is not complete, at step 74 of FIG. 4B, cycle accurate simulator 12 determines an additional number of Y-number of cycles needed to complete the requested operation. Y-number of cycles is a minimum number of cycles estimated to be needed to complete the requested operation. In a preferred embodiment of the present invention, Y-number of cycles is set equal to X-number of cycles. In another embodiment of the present invention, Y-number of cycles is not set equal to X-number of cycles and is determined by other methods (e.g., statistical methods based on an average completion time from other requests). At step 76, a "not-ready" result for the requested operation is returned to the requesting simulated component including the Y-number of cycles estimated to be needed to finish the operation. At step 78, a second event is set at Y-number of cycles. Steps 72, 74, 76, and 78 are repeated until the requested operation completes. The requested operation can complete before Y-number of cycles are executed, although Y-number of cycles are still completed before the cycle-accurate simulator 12 receives the second event and returns a result. The number of cycles required to complete the requested event is recorded, even though the requested even may complete at X+1-number of cycles and cycle-accurate simulator 12 does not receive the second event until Y-number more cycles are executed. If the requested operation is complete at step 72, then at step 80 the results of the operation are returned to the requesting simulated component. The results include the total number of cycles required to complete the requested operation. The total number of cycles required to complete the requested operation may be less than X+Y number of cycles executed by cycle-accurate simulator 12.

An example of the use of method 64 includes a request for 32-bit memory read from a simulated memory by a simulated hardware device such as central processing unit. At step 66 in FIG. 4A, a request for the simulated 32-bit memory read operation (e.g., read32) is received on cycle-accurate simulator 12. Cycle accurate simulator 12 determines the requested operation needs X-number of cycles to complete the requested operation. In this example, the requested simulated memory read operation is expected to need ten cycles, so X-number of cycles is equal to ten. At step 68, a first event is set at ten cycles on cycle-accurate simulator 12. At step 70, ten cycles are executed on the cycle-accurate simulator and the first event occurs (e.g., an interrupt). At step 72, a test is conducted to determine whether the requested memory read operation is complete after ten cycles. If the requested operation is not complete, at step 74 of FIG. 4B, Y-number of cycles estimated to be needed to complete the requested read memory operation is determined, wherein Y-number of cycles is a minimum number of cycles needed to complete the requested operation. At step 76, a not-ready result is returned for the requested memory read operation to the requesting simulated hardware component. The simulated hardware component is able to determine that the requested memory read operation requires more than the ten cycles that was originally estimated using the not-ready result. This information can be used to verify functionality in the simulated hardware component and correct timing or other behavioral problems.

In one embodiment of the present invention, the not-ready result includes a constant MMKR_NOT_READY with a value of 0x80000000 on which a logical OR operation is performed with the value for a number of cycles estimated to be needed to complete a requested operation. However, other not-ready results could also be used. At step 78, a second event is set at Y-number of cycles, a second event is set at ten cycles. Steps 72, 74, 76, and 78 are repeated until the requested operation completes.

If the memory read operation completed in eleven clock cycles, cycle-accurate simulator 12 would not check the status of the memory read operation again until the X+Y number of cycles (e.g., 20 cycles). However, the results returned for the memory read operation indicate the number of clock cycles required to complete the operation (e.g., eleven clock cycles), so the requesting simulated component can determine the timing and behavior of the requested operation.

A preferred embodiment of the present invention offers several advantages over the prior art. A system for a preferred embodiment of the present invention provides a cycle-accurate simulator that is used with a simulator library and a simulator extension application programming interface to model and verify internal (e.g., on-chip) and external (e.g., off-chip) hardware components for system-on-a-chip and other electrical systems. The simulator library provides various built-in routines for simulating hardware and software components, while the simulator extension application programming interface allows an interface for user-customized routines for simulating hardware and software components. The methods provide a first method to simulate a requested operation far in the future using a fixed-length cycle counter, and a second method to receive a not-ready response for a requested operation, when the requested operation takes longer than an estimated number of cycles in the cycle-accurate simulator. Thus, a developer is provided with greater flexibility to design, verify and develop hardware and software components for a desired electrical device. A preferred embodiment of the present invention helps to shrink development time, as well as helps to decrease development costs required for a desired electrical device.

It should be understood that the programs, processes, methods and apparatus described herein are not related or limited to any particular type of computer or network apparatus (hardware or software), unless indicated otherwise. Various types of general purpose or specialized computer apparatus may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

The claims should not be read as limited to the described order or elements unless stated to that effect. Therefore, all embodiments that come within the scope and spirit of the following claims and equivalents thereto are claimed as the invention.

I claim:

1. A hardware-software design verification system, the system comprising:
   a cycle-accurate simulator that simulates hardware and software components in a desired electronic device, wherein X-number of simulator cycles correspond to Y-number of cycles on a simulated hardware component, wherein the cycle-accurate simulator is event-driven, and events are used to determine timing behavior and interactions of simulated hardware and software components in the desired electronic device;
   a simulator library including a plurality of built-in routines for modeling and verifying internal and external hardware components for a desired electronic device, wherein the simulator library allows internal and external hardware components to be modeled and verified with the plurality of built-in routines and wherein one or more of the plurality of built-in routines return a number of cycles executed on the cycle-accurate simulator during a simulated operation;
   a simulator extension application programming interface that provides an interface to the plurality of built-in routines in the simulator, wherein the simulator application programming interface also allows external and internal hardware components to be modeled with user-customized routines used with the cycle-accurate simulator.

2. The system of claim 1 further comprising:
   a graphical user interface, for providing inputs to, and receiving outputs from the cycle-accurate simulator.

3. The system of claim 1, wherein the internal hardware components are on-chip hardware components, and the external hardware components are off-chip hardware components for a system-on-a-chip being verified for the desired electronic device.

4. The system of claim 1, wherein the simulated hardware components include any of a central processing unit, memory, digital signal processor, memory management unit, cache, bus, timer, or a universal asynchronous receiver transmitter.

5. The system of claim 1, wherein the simulator library includes built-in routines for simulating any of M-Core, PowerPC, CPU32, CPU32+ or 68000 families of central processing units.

6. The system of claim 1, wherein the cycle-accurate simulator includes an instruction timing mode that determines the total number of cycles required to execute a general operation, but does not simulate the order of timing of individual operations that make up the general operation.

7. The system of claim 1, wherein the simulator library comprises a plurality of routines on a computer readable medium including:
   a routine for setting a clock for a simulated component to a new clock speed;
   a routine for coordinating between a simulated component clock and a cycle-accurate simulator clock;
   a routine for handling events that occur before or during a current clock cycle;
   a routine for sending a notification of changes in registers during a simulated operation;
   a routine for setting one or more individual sub-components of a simulated hardware component;
   a routine to lock and unlock a simulated bus;
   a routine to set operation of a simulated component in a low power mode;
   a routine for setting an event to occur at a desired cycle on the cycle-accurate simulator;
   a routine for changing interrupt vectors and interrupt priority levels for a simulated component;
   a routine for accessing a desired register on a simulated component; and
   a routine to add a simulated register to a simulated component.

8. The system of claim 1 wherein X-number of cycles of simulator cycles on the cycle-accurate simulator is greater than Y-number of cycles on a simulated hardware component.

9. A hardware-software design verification system, the system comprising:
   a cycle-accurate simulator, for simulating hardware and software components for a system-on-a-chip, wherein X-number of simulator cycles correspond to Y-number of cycles on a simulated hardware component, wherein the cycle-accurate simulator is event-driven, and events are used to determine timing behavior and interactions of simulated hardware and software components in the system-on-a-chip;
   a simulator library, for modeling and verifying on-chip and off-chip hardware components for a system-on-a-chip, wherein the simulator library allows on-chip and off-chip hardware components to be modeled with a plurality of built-in routines used with the cycle-accurate simulator and wherein one or more of the plurality of built-in routines return a number of cycles executed on the cycle accurate simulator during a simulated operation;

a simulator application programming interface, for modeling and verifying hardware components for a system-on-a-chip, wherein the simulator application programming interface allows on-chip and off-chip hardware components to be modeled with user-customized routines used with the cycle-accurate simulator.

10. A method for hardware-software verification in a simulator, the method comprising the steps of:

(a) receiving a request for a simulated operation from a simulated hardware component on a cycle-accurate simulator, wherein the requested simulated operation requests X-number of cycles on the cycle-accurate simulator and the cycle-accurate simulator has a cycle-counter of a fixed length for counting Y-number of cycles, wherein Y is less than X;

(b) setting an event to occur at X-number of cycles on the cycle-accurate simulator;

(c) executing Z-number of cycles on the cycle-accurate simulator, wherein the Z-number of cycles is less than Y-number of cycles and the Z-number of cycles are counted in the cycle-counter;

(d) determining whether X-Z number of cycles remaining for the event can be executed in Y-Z number of cycles remaining in the cycle-counter, and if not, (e) subtracting N-number of cycles from X-number of cycles to adjust the number of cycles remaining for the event, thereby creating an adjusted event;

(f) subtracting M-number of cycles from the Y-Z number of cycles remaining in the cycle counter, thereby creating an adjusted cycle-counter count corresponding to the adjusted event;

(g) repeating steps (c), (d), (e) and (f) until the number of cycles remaining to reach the adjusted event can be executed within the Y-Z number of cycles remaining in the adjusted cycle-counter count.

11. The method of claim 10 wherein steps (a)–(g) are stored on a computer readable medium.

12. The method of claim 10 wherein the event is an interrupt.

13. The method of claim 10 wherein the N-number of cycles is equal to the M-number of cycles.

14. The method of claim 10 wherein the N-number of cycles is not equal to the M-number of cycles.

15. A method for hardware-software verification in a simulator, the method comprising the steps of:

receiving a request for a simulated operation in a cycle-accurate simulator from a simulated component;

determining on the cycle accurate simulator X-number of cycles needed to complete the requested simulated operation;

setting a first event at X-number of cycles on the cycle-accurate simulator;

executing X-number of cycles on the cycle-accurate simulator;

determining whether the requested simulated operation is complete at the first event after X-number of cycles, and if not, determining on the cycle-accurate simulator Y-number of cycles needed to complete the requested simulated operation, wherein Y-number of cycles is a minimum number of cycles needed to complete the requested simulated operation;

setting a second event at Y-number of clock cycles; and returning a not-ready result for the requested simulated operation to the simulated component including the Y-number of cycles.

16. The method of claim 15 wherein the method steps are stored on a computer readable medium.

17. The method of claim 15 further comprising:

determining whether the requested simulated operation is complete after X-number of cycles, and if so, returning results of the requested simulated operation, wherein the results include an actual number of cycles required to complete the requested simulated operation.

18. The method of claim 15 wherein the simulated component is any of a simulated hardware component or a simulated software component.

19. The method of claim 15 wherein the event is an interrupt.

20. The method of claim 15 further comprising:

executing Y-number of cycles on the cycle-accurate simulator;

determining whether the requested simulated operation is complete at the second event after Y-number of cycles, and if so returning an actual number of cycles required to complete the requested simulated operation to the simulated component.

21. A computer readable medium having stored therein a set of built-in general purpose routines for implementing a simulator library used for simulating hardware and software components on a cycle-accurate simulator, the computer readable medium comprising:

a routine for setting a clock for a simulated component to a new clock speed;

a routine for coordinating between a simulated component clock and a cycle-accurate simulator clock;

a routine for handling events that occur before or during a current clock cycle;

a routine for sending a notification of changes in registers during a simulated operation; and a routine for setting one or more individual sub-components of a simulated hardware component.

22. The computer readable medium of claim 21 further comprising:

a routine to lock and unlock a simulated bus; and a routine to set operation of a simulated component in a low power mode.

23. A computer readable medium having stored therein a set of built-in call-back routines for implementing a simulator library used for simulating hardware and software components on a cycle-accurate simulator, the computer readable medium comprising:

a routine for setting an event to occur at a desired cycle for a simulated component on the cycle-accurate simulator;

a routine for changing interrupt vectors and interrupt priority levels for a simulated component on the cycle-accurate simulator for a desired event;

a routine for accessing a desired register on a simulated component on the cycle-accurate simulator after an event has occurred; and a routine for adding a simulated register to a simulated component on the cycle-accurate simulator for a desired event.

24. A method for hardware-software verification in a simulator, the method comprising the steps of:

receiving a request for a simulated operation on a cycle-accurate simulator from a simulated component, wherein the requested simulated operation needs X-number of cycles on the cycle-accurate simulator to complete the requested simulated operation; and returning a result to the simulated component, wherein the result includes Y-number of cycles, an actual number of cycles on the cycle-accurate simulator used to complete the requested simulated operation.

25. The method of claim 24 wherein the method steps are stored on a computer readable medium.

26. A method for hardware verification in a cycle-accurate simulator, the method comprising the steps of:

receiving a request for a simulated operation from a simulated hardware component on a cycle-accurate simulator, wherein the requested simulated operation on the simulated hardware component requests X-number of cycles on the cycle-accurate simulator and the cycle-accurate simulator has a cycle-counter of a fixed length for counting Y-number of cycles, wherein Y is less than X; and periodically adjusting the cycle-counter and the X-number of cycles by a pre-determined value to allow the cycle-accurate simulator with the cycle-counter of a fixed length for counting Y-number of cycles to provide a requested simulated operation for the simulated hardware component request at X-number of cycles, wherein Y is less than X.

27. The method of claim 26 wherein the method steps are stored on a computer readable medium.

* * * * *